(12) United States Patent
Park et al.

(10) Patent No.: US 11,343,922 B2
(45) Date of Patent: May 24, 2022

(54) BEZEL-LESS FLEXIBLE DISPLAY DEVICE AND ELECTRONIC DEVICE INCLUDING THE SAME

(71) Applicant: Samsung Display Co., Ltd., Yongin-Si (KR)

(72) Inventors: Sangho Park, Hwaseong-si (KR); Taehyun Kim, Seoul (KR); Seungmin Lee, Hwaseong-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 0 days.

(21) Appl. No.: 15/959,602

(22) Filed: Apr. 23, 2018

(65) Prior Publication Data

US 2018/0343755 A1 Nov. 29, 2018

(30) Foreign Application Priority Data

May 26, 2017 (KR) .................. 10-2017-0065592

(51) Int. Cl.
| | |
|---|---|
| *H05K 5/00* | (2006.01) |
| *H04M 1/02* | (2006.01) |
| *H05K 5/03* | (2006.01) |
| *G06F 1/16* | (2006.01) |

(52) U.S. Cl.
CPC ........ *H05K 5/0017* (2013.01); *H04M 1/0266* (2013.01); *H05K 5/03* (2013.01); *G06F 1/1626* (2013.01)

(58) Field of Classification Search
CPC ..... H05K 5/0017; H05K 5/03; H04M 1/0266; G06F 1/1626

See application file for complete search history.

(56) References Cited

U.S. PATENT DOCUMENTS

| | | | |
|---|---|---|---|
| 8,077,235 B2 | 12/2011 | Street | |
| 8,976,141 B2* | 3/2015 | Myers | ................ G06F 1/1643 |
| | | | 345/173 |
| 9,429,997 B2 | 8/2016 | Myers et al. | |
| 9,430,180 B2* | 8/2016 | Hirakata | ............. H01L 51/0097 |
| 9,431,955 B1 | 8/2016 | Northcutt et al. | |
| 10,073,198 B2 | 9/2018 | Niu | |

(Continued)

FOREIGN PATENT DOCUMENTS

| | | |
|---|---|---|
| CN | 104965330 A | 10/2015 |
| CN | 105321429 A | 2/2016 |

(Continued)

OTHER PUBLICATIONS

Chinese Office Action for Application No. 201810517041.6 dated May 6, 2021 enumerating the above listed references in the Chinese Office Action.

(Continued)

*Primary Examiner* — Rockshana D Chowdhury
*Assistant Examiner* — Douglas R Burtner
(74) *Attorney, Agent, or Firm* — Cantor Colburn LLP

(57) ABSTRACT

A display device may include a window panel including a front area and side areas extended from the front area and a flexible display panel disposed under the window panel, the flexible display panel including a flat display area corresponding to the front area and flexible display areas extended from the flat display area. At least one vertex of the flat display area is rounded.

38 Claims, 15 Drawing Sheets

(56) References Cited

U.S. PATENT DOCUMENTS

| | | | |
|---|---|---|---|
| 10,096,792 B2 | 10/2018 | Ahn et al. | |
| 10,142,547 B2* | 11/2018 | Yamazaki | G06F 1/1647 |
| 10,165,678 B2* | 12/2018 | Jung | H05K 7/02 |
| 10,394,069 B2* | 8/2019 | Yamazaki | G09G 3/3648 |
| 10,411,084 B2* | 9/2019 | Yeo | H01L 27/3279 |
| D862,406 S * | 10/2019 | Choi | D14/138 G |
| 10,431,604 B2* | 10/2019 | Cho | G09G 3/3233 |
| 10,496,133 B2* | 12/2019 | Jin | G06F 3/041 |
| 10,510,980 B2* | 12/2019 | Yang | G06F 1/1643 |
| 10,615,239 B2* | 4/2020 | Jin | H01L 27/3267 |
| 10,747,431 B2* | 8/2020 | Ryu | G06F 3/017 |
| 10,903,299 B2* | 1/2021 | Shim | G06F 1/1601 |
| 11,042,237 B2* | 6/2021 | Lee | H01L 51/525 |
| 11,083,054 B2* | 8/2021 | Ka | G06F 1/1643 |
| 2012/0218219 A1* | 8/2012 | Rappoport | H01L 27/3288 345/174 |
| 2013/0002583 A1* | 1/2013 | Jin | G06F 1/1637 345/173 |
| 2014/0132488 A1 | 5/2014 | Kim et al. | |
| 2014/0240289 A1 | 8/2014 | Myers et al. | |
| 2014/0368228 A1 | 12/2014 | Kim | |
| 2015/0138041 A1* | 5/2015 | Hirakata | G06F 3/0412 345/1.3 |
| 2015/0169274 A1* | 6/2015 | Holung | G06F 3/1423 345/1.3 |
| 2016/0299527 A1* | 10/2016 | Kwak | G06F 1/1626 |
| 2016/0357318 A1* | 12/2016 | Chan | G06F 3/0445 |
| 2017/0077195 A1 | 3/2017 | Seo et al. | |
| 2017/0205923 A1* | 7/2017 | Shim | G06F 3/0416 |
| 2017/0288006 A1* | 10/2017 | Yang | H01L 27/3225 |
| 2018/0113241 A1* | 4/2018 | Powell | G06F 1/1626 |
| 2018/0160554 A1* | 6/2018 | Kang | G09F 9/301 |
| 2018/0307270 A1* | 10/2018 | Pantel | H04M 1/0264 |
| 2018/0368270 A1* | 12/2018 | Seo | G06F 1/16 |
| 2019/0050094 A1* | 2/2019 | Zeng | G06F 3/0412 |
| 2019/0394373 A1* | 12/2019 | Zhang | H04M 1/0264 |
| 2021/0291493 A1* | 9/2021 | Kim | B32B 27/08 |

FOREIGN PATENT DOCUMENTS

| | | |
|---|---|---|
| CN | 105741685 A | 7/2016 |
| CN | 105874525 A | 8/2016 |
| CN | 106406443 A | 2/2017 |
| CN | 106488668 A | 3/2017 |
| CN | 106502439 A | 3/2017 |
| CN | 106502440 A | 3/2017 |
| JP | 2008307084 A | 12/2008 |
| JP | 20161457 A | 1/2016 |
| KR | 1020150136317 A | 12/2015 |
| KR | 101642808 B1 | 7/2016 |
| KR | 1020160082252 A | 7/2016 |
| KR | 1020160121031 A | 10/2016 |
| KR | 1020170109139 A | 9/2017 |

OTHER PUBLICATIONS

Korean Office Action for Application No. 10-2017-0065592 dated Aug. 11, 2021 enumerating the above listed references.

* cited by examiner

BEZEL-LESS FLEXIBLE DISPLAY DEVICE AND ELECTRONIC DEVICE INCLUDING THE SAME

This application claims priority to Korean Patent Application No. 10-2017-0065592, filed on May 26, 2017, and all the benefits accruing therefrom under 35 U.S.C. § 119, the content of which in its entirety is herein incorporated by reference.

BACKGROUND

1. Technical

Exemplary embodiments relate generally to a display device and an electronic device having the display device. More particularly, embodiments of the invention relate to a pixel and a display device including the pixel.

2. Description of the Related Art

An electronic device such as a smart phone, a tablet personal computer ("PC") provides various functions by displaying an image on a screen. Generally, a display device included in the electronic device for displaying the image may include a display area and a bezel area that surrounds the display area. Recently, a study for diversifying application of the display device by reducing or deleting the bezel area is studying.

SUMMARY

Exemplary embodiments relate to a bezel-less display device.

Exemplary embodiments relate to an electronic device including a bezel-less display device.

According to an exemplary embodiment of the invention, a display device may include: a window panel including a front area and side areas extending from the front area; and a flexible display panel disposed under the window panel, where the flexible display panel includes a flat display area corresponding to the front area and flexible display areas extending from the flat display area. In such an embodiment, the flat display area has a rounded vertex.

In an exemplary embodiment, the flat display area may have a polygon shape, a vertex of which is rounded.

In an exemplary embodiment, the flexible display areas of the flexible display panel may correspond to the side areas of the window panel, respectively.

In an exemplary embodiment, each of the flat display areas may have a rectangular shape.

In an exemplary embodiment, the flexible display panel may include a first flexible display area extending from the flat display area in a horizontal direction, a second flexible display area extending from the flat display area in the horizontal direction, a third flexible display area extending form the flat display area in a vertical direction, and a fourth flexible display area extending form the flat display area in the vertical direction.

In an exemplary embodiment, the first flexible display area and the third flexible display area may be spaced apart from each other, the third flexible display area and the second flexible display area may be spaced apart from each other, the second flexible display area and the fourth flexible display area may be spaced apart from each other, and the fourth flexible display area and the first flexible display area may be spaced apart from each other.

In an exemplary embodiment, a length of the first flexible display area in the vertical direction and a length of the second flexible display area in the vertical direction may be shorter than a length of the flat display area in the vertical direction, and a length of the third flexible display area in the horizontal direction and a length of the fourth flexible display area in the horizontal direction may be shorter than a length of the flat display area in the horizontal direction.

In an exemplary embodiment, the front area of the window panel may have a polygon shape, a vertex of which is rounded.

In an exemplary embodiment, each of the side areas of the window panel may have a rectangular shape.

In an exemplary embodiment, the window panel may include a first side area extending from the front area in a horizontal direction, a second side area extending from the front area in the horizontal direction, a third side area extending from the front area in a vertical direction, and a fourth side area extending from the front area in the vertical direction.

In an exemplary embodiment, the first side area and the third side area may be spaced apart from each other, third side area and the second side area may be spaced apart from each other, the second side area and the fourth side area may be spaced apart from each other, and the fourth side area and the first side area may be spaced apart from each other.

In an exemplary embodiment, a length of the first side area in the vertical direction and a length of the side area in the vertical direction may be shorter than a length of the front area in the vertical direction, and a length of third side area in the horizontal direction and a length of the fourth side area in the horizontal direction may be shorter than a length of the front area in the horizontal direction.

In an exemplary embodiment, the display device may further include a back-side member including a protrusion region combined with the vertex of the front area, and flat regions combined with the first side area, the second side area, the third side area and the fourth side area, respectively.

In an exemplary embodiment, the first side area and the third side area may be coupled to each other, the third side area and the second side area may be coupled to each other, the second side area and the fourth side area may be coupled to each other, and the fourth side area and the first side area may be coupled to each other.

In an exemplary embodiment, the display device may further include a back-side member including a flat region combined with the first side area, the second side area, the third side area and the fourth side area.

In an exemplary embodiment, the display device may further include a back-side member combined with the window panel and the flexible display panel.

In an exemplary embodiment, the display device may further include a back-side member combined with the flexible display panel.

In an exemplary embodiment, the display device may further include a back-side member combined with the window panel.

According to another exemplary embodiment of the invention, an electronic device may include a display device and a processor which controls the display device. In such an embodiment, the display device includes: a window panel including a front area and side areas extending form the front area; and a flexible display panel disposed under the window panel, where the flexible display panel includes a flat display area corresponding to the front area and flexible display areas extending from the flat display area. In such an embodiment, the flat display area has a rounded vertex.

In an exemplary embodiment, the flat display area may have a polygon shape, a vertex of which is rounded.

In an exemplary embodiment, the flexible display areas of the flexible display panel may correspond to the side areas of the window panel, respectively.

In an exemplary embodiment, each of the flat display areas may have a rectangular shape.

In an exemplary embodiment, the flexible display panel may include a first flexible display area extending from the flat display area in a horizontal direction, a second flexible display area extending from the flat display area in the horizontal direction, a third flexible display area extending form the flat display area in a vertical direction, and a fourth flexible display area extending form the flat display area in the vertical direction.

In an exemplary embodiment, the first flexible display area and the third flexible display area may be spaced apart from each other, the third flexible display area and the second flexible display area may be spaced apart from each other, the second flexible display area and the fourth flexible display area may be spaced apart from each other, and the fourth flexible display area and the first flexible display area may be spaced apart from each other.

In an exemplary embodiment, a length of the first flexible display area in the vertical direction and a length of the second flexible display area in the vertical direction may be shorter than a length of the flat display area in the vertical direction, and a length of the third flexible display area in the horizontal direction and a length of the fourth flexible display area in the horizontal direction may be shorter than a length of the flat display area in the horizontal direction.

In an exemplary embodiment, the front area of the window panel may have a polygon shape, a vertex of which is rounded.

In an exemplary embodiment, each of the side areas of the window panel may have a rectangular shape.

In an exemplary embodiment, the window panel may include a first side area extending from the front area in a horizontal direction, a second side area extending from the front area in the horizontal direction, a third side area extending from the front area in a vertical direction, and a fourth side area extending from the front area in the vertical direction.

In an exemplary embodiment, the first side area and the third side area may be spaced apart from each other, third side area and the second side area may be spaced apart from each other, the second side area and the fourth side area may be spaced apart from each other, and the fourth side area and the first side area may be spaced apart from each other.

In an exemplary embodiment, a length of the first side area in the vertical direction and a length of the side area in the vertical direction may be shorter than a length of the front area in the vertical direction, and a length of third side area in the horizontal direction and a length of the fourth side area in the horizontal direction may be shorter than a length of the front area in the horizontal direction.

In an exemplary embodiment, the display device may further include a back-side member including a protrusion region combined with the vertex of the front area, and flat regions combined with the first side area, the second side area, the third side area and the fourth side area, respectively.

In an exemplary embodiment, the first side area and the third side area may be coupled to each other, the third side area and the second side area may be coupled to each other, the second side area and the fourth side area may be coupled to each other, and the fourth side area and the first side area may be coupled to each other.

In an exemplary embodiment, the display device may further include a back-side member including a flat region combined with the first side area, the second side area, the third side area and the fourth side area.

In an exemplary embodiment, the display device may further include a back-side member combined with the window panel and the flexible display panel.

In an exemplary embodiment, the display device may further include a back-side member combined with the flexible display panel.

In an exemplary embodiment, the display device may further include a back-side member combined with the window panel.

Therefore, embodiments a display device and an electronic device having the display device may not include a bezel by including a flexible display panel that includes a flat display area and flexible display areas extending from the flat display area and bent.

BRIEF DESCRIPTION OF THE DRAWINGS

The above and other features of the invention will become more apparent by describing in detailed exemplary embodiments thereof with reference to the accompanying drawings, in which.

DETAILED DESCRIPTION

Figure 1:
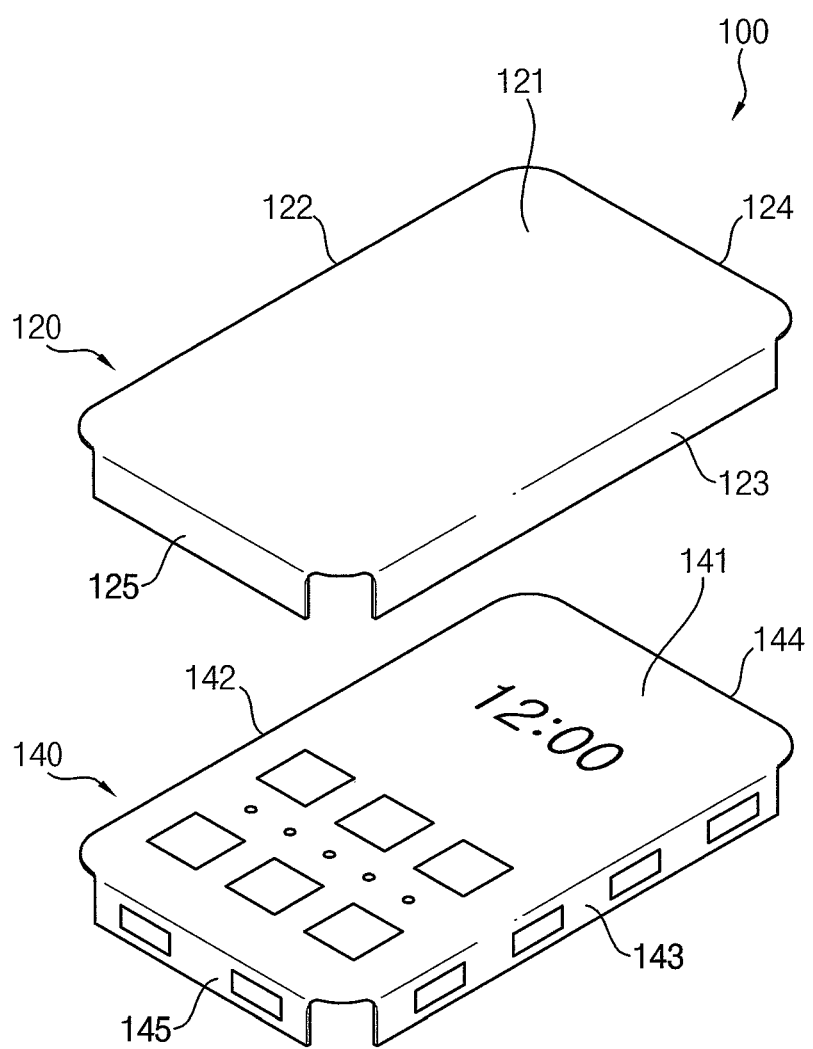
FIG. 1 is a diagram illustrating a display device according to an exemplary embodiment.

The invention now will be described more fully hereinafter with reference to the accompanying drawings, in which various embodiments are shown. This invention may, however, be embodied in many different forms, and should not be construed as limited to the embodiments set forth herein. Rather, these embodiments are provided so that this disclosure will be thorough and complete, and will fully convey the scope of the invention to those skilled in the art. Like reference numerals refer to like elements throughout.

It will be understood that when an element is referred to as being "on" another element, it can be directly on the other element or intervening elements may be therebetween. In contrast, when an element is referred to as being "directly on" another element, there are no intervening elements present.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

The terminology used herein is for the purpose of describing particular embodiments only and is not intended to be limiting. As used herein, the singular forms "a," "an," and "the" are intended to include the plural forms, including "at least one," unless the content clearly indicates otherwise. "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the disclosure, and will not be interpreted in an idealized or overly formal sense unless expressly so defined herein.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the claims.

Hereinafter, exemplary embodiments of the invention will be described in detail with reference to the accompanying drawings.

Figure 2A:
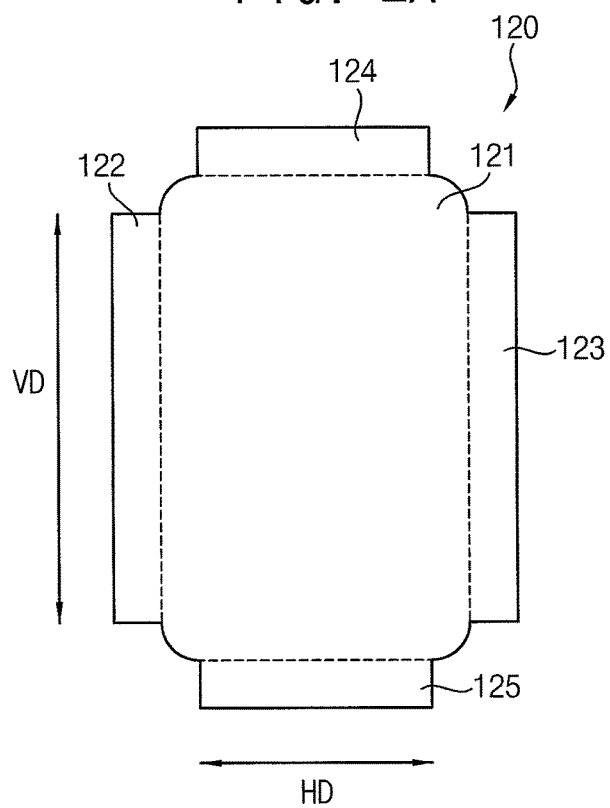
FIG. 2A is a diagram illustrating a window panel included in the display device of FIG. 1.
Figure 2B:
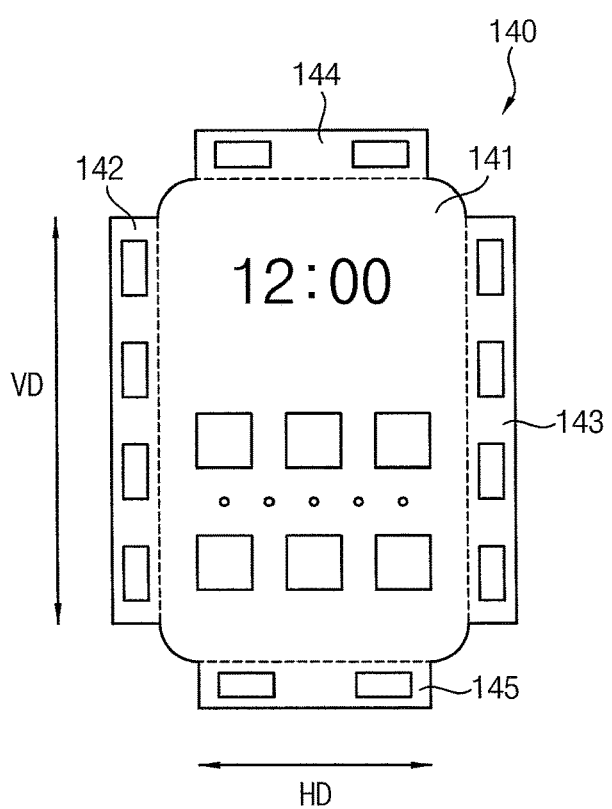
FIG. 2B is a diagram illustrating a flexible display panel included in the display device of FIG. 1.

FIG. 1 is a diagram illustrating a display device according to an exemplary embodiment. FIG. 2A is a diagram illustrating a window panel included in the display device of FIG. 1, and FIG. 2B is a diagram illustrating a flexible display panel included in the display device of FIG. 1.

Referring to FIG. 1, an exemplary embodiment of a display device 100 may include a window panel 120 and a flexible display panel 140.

The window panel 120 may include a front area 121 and side areas 122, 123, 124, 125. The side areas 122, 123, 124, 125 may extend from the front area 121 and be bent to from a predetermined angle with the front area 121. In one exemplary embodiment, for example, the side areas 122, 123, 124, 125 may form an angle greater than 90 degrees and less than 150 degrees with the front area 121. The front area 121 of the window panel 120 may have a rounded vertex or a rounded corner. The window panel 120 may have a polygon shape, a vertex of which is rounded. In an exemplary embodiment, as shown in FIG. 1, the front area 121 of the window panel 120 may have a rectangular shape, vertexes of which are rounded. The side areas 122, 123, 124, 125 extending from the front area 121 may have a rectangular shape. The side areas 122, 123, 124, 125 may be spaced apart from each other. The window panel 120 may include a substrate which may be molded from a mixture of a glass fiber and a synthetic resin such as, for example, acryl resin, polycarbonate ("PC"), and polyethylene terephthalate ("PET"). The window panel 120 may protect the flexible display panel 140 disposed thereunder or covered thereby.

The flexible display panel 140 may be disposed under the window panel 120. The flexible display panel 140 may include a flat display area 141 and flexible display areas (or bendable display areas) 142, 143, 144, 145. The flat display area 141 of the flexible display panel 140 may have a shape corresponding to that of the front area 121 of the window panel 120. The flexible display areas 142, 143, 144, 145 may have shapes corresponding to those of the side areas 122, 123, 124, 125, respectively. The flexible display panel 140 may have flexibility. The flexible display panel 140 may be bent. The flexible display areas 142, 143, 144, 145 may extend from the flat display area 141 and be bent to form a predetermined angle with the flat display area 141. In one exemplary embodiment, for example, the flexible display areas 142, 143, 144, 145 may form an angle greater than 90 degrees and less than 150 degrees with the flat display area 141. The flat display area 141 of the flexible display panel 140 may have a rounded vertex or a rounded corner. In an exemplary embodiment, as shown in FIG. 1, the flat display area 141 of the flexible display panel 140 may have a rectangular shape. The flexible display areas 142, 143, 144, 145 may be spaced apart from each other. A plurality of pixels may be disposed in the flat display area 141 and the flexible display areas 142, 143, 144, 145 of the flexible display panel 140. The pixels in the flat display area 141 and the flexible display areas 142, 143, 144, 145 may emit light in response to a signal input to the pixels. Each of the flat display area 141 and the flexible display areas 142, 143, 144, 145 may display an image.

The window panel 120 may disposed above the flexible display panel 140. The window panel 120 may protect the flexible display panel 140. The window panel 120 of FIG. 1 may cover the flat display area 141 and the flexible display areas 142, 143, 144, 145 of the flexible display panel 140. In such an embodiment, the side areas 122, 123, 124, 125 of the window panel 120 may be bent to cover the flexible display areas 142, 143, 144, 145 of the flexible display panel 140 in a bent state, respectively.

Referring to FIG. 2A, an exemplary embodiment of the window panel 120 may include the front area 121, a first side area 122, a second side area 123, a third side area 124 and a fourth side area 125. The first side area 122 and the second side area 123 may extend from the front area 121 in a horizontal direction HD when the window panel 120 is in an unbent state. The third side area 124 and the fourth side area 125 may extend form the front area 121 in a vertical direction VD when the window panel 120 is in the unbent state. The front area 121 of the window panel 120 may have a rounded vertex or a rounded corner. The front area 121 of the window panel 120 may have the rectangular shape, a vertex of which is rounded, as shown in FIG. 2A. In an exemplary embodiment, areas of the window panel 120 except the vertexes thereof may extend from sides of the window panel, thereby defining the first through fourth side areas 122, 123, 124, 125. In such an embodiment, a length of the first side area 122 in the vertical direction VD and a length of the second side area 123 in the vertical direction VD may be shorter than a length of the front area 121 in the vertical direction VD, and a length of the third side area 124 in the horizontal direction HD and a length of the fourth side area 125 in the horizontal direction HD may be shorter than a length of the front area 121 in the horizontal direction HD. Each of the first side area 122, the second side area 123, the third side area 124 and the fourth side area 125 may be bent downwardly at a boundary thereof with the front area 121 (shown with a dotted line in FIG. 2A). In such an embodiment, when the window panel 120 is in a bent state (e.g., in a state where the first through fourth side areas 122, 123, 124, 125 are bent downwardly as shown in FIG. 1), the first side area 122 and the third side area 124 may be spaced apart from each other, the third side area 124 and the second side area 123 may be spaced apart from each other, the second side area 123 and the fourth side area 125 may be spaced apart from each other, and the fourth side area 125 and the first side area 122 may be spaced apart from each other, as shown in FIG. 1. In an exemplary embodiment, the window panel 120 in the unbent state as shown in FIG. 2A may be manufactured, and then may be bent to form the window panel 120 in the bent state as shown in FIG. 1, but a manufacturing method of the window panel 120 is not limited thereto. In one alternative exemplary embodiment, for example, the window panel 120 may be molded to have a shape corresponding to the shape of the window panel 120 in the bent state as shown in FIG. 1.

Referring to FIG. 2B, the flexible display panel 140 may include the flat display area 141, a first flexible display area 142, a second flexible display area 143, a third flexible display area 144 and a fourth flexible display area 145. The first flexible display area 142 and the second flexible display area 143 may extend from the flat display area 141 in the horizontal direction HD when the flexible display panel 140 is in an unbent state. The third flexible display area 144 and the fourth flexible display area 145 may extend from the flat display area 141 in the vertical direction VD when the flexible display panel 140 is in the unbent state. The flat display area 141 of the flexible display panel 140 may have a rounded vertex or a rounded corner. The flat display area 141 of the flexible display panel 140 may have a rectangular shape, vertex of which is rounded as shown in FIG. 2B. Areas of the flexible display panel 140 except the vertexes thereof may extend to define the first through fourth flexible display area 142, 143, 144, 145, as shown in FIG. 2B. In such an embodiment, a length of the first flexible display area 142 in the vertical direction VD and a length of the second flexible display area 143 in the vertical direction VD may be shorter than a length of the flat display area 141 in the vertical direction VD. A length of the third flexible display area 144 in the horizontal direction HD and a length of the fourth flexible display area 145 in the horizontal direction HD may be shorter than a length of the flat display area 141 in the horizontal direction HD. Each of the first flexible display area 142, the second flexible display area 143, the third flexible display area 144 and the fourth flexible display area 145 may be bent at a boundary thereof with the flat display area 141 (shown with a dotted line in FIG. 2B). When the flexible display panel 140 is in a bent state, the first flexible display area 142 and the third flexible display area 144 may be spaced apart from each other, the third flexible display area 144 and the second flexible display area 143 may be spaced apart from each other, the second flexible display area 143 and the fourth flexible display area 145 may be spaced apart from each other, and the fourth flexible display area 145 and the first flexible display area 142 may be spaced apart from each other as shown in FIG. 1. Thus, the display device 100 may not have bezel when viewed from a front plan view. Here, a front side or surface means a display side or surface of the display device 100

In an exemplary embodiment of the display device 100, as shown in FIGS. 1, 2A and 2B, the front area 121 of the window panel 120 and the flat display area 141 of the flexible display panel 140 are in the rectangular shape, a vertex of which is rounded, but the shape of the front area 121 of the window panel 120 and the flat display area 141 of the flexible display panel 140 are not limited thereto. In an exemplary embodiment, the front area 121 of the window panel 120 and the flat display area 141 of the flexible display panel 140 may be in a polygon shape, a vertex of which is rounded. In one exemplary embodiment, for example, the front area 121 of the window panel 120 and the flat display area 141 of the flexible display panel 140 may have a pentagon shape or a hexagon shape.

In an exemplary embodiment, as described above, the display device 100 may not include a bezel (i.e., a non-display area) when viewed from the front side, or a bezel-less display device may be effectively manufactured, by including the flexible display panel 140 that includes the flat display area 141, a vertex of which is rounded, and the flexible display areas 142, 143, 144, 145 extending from the flat display area 141 and bent (e.g., extending downwardly from the flat display area 141).

Figure 3:
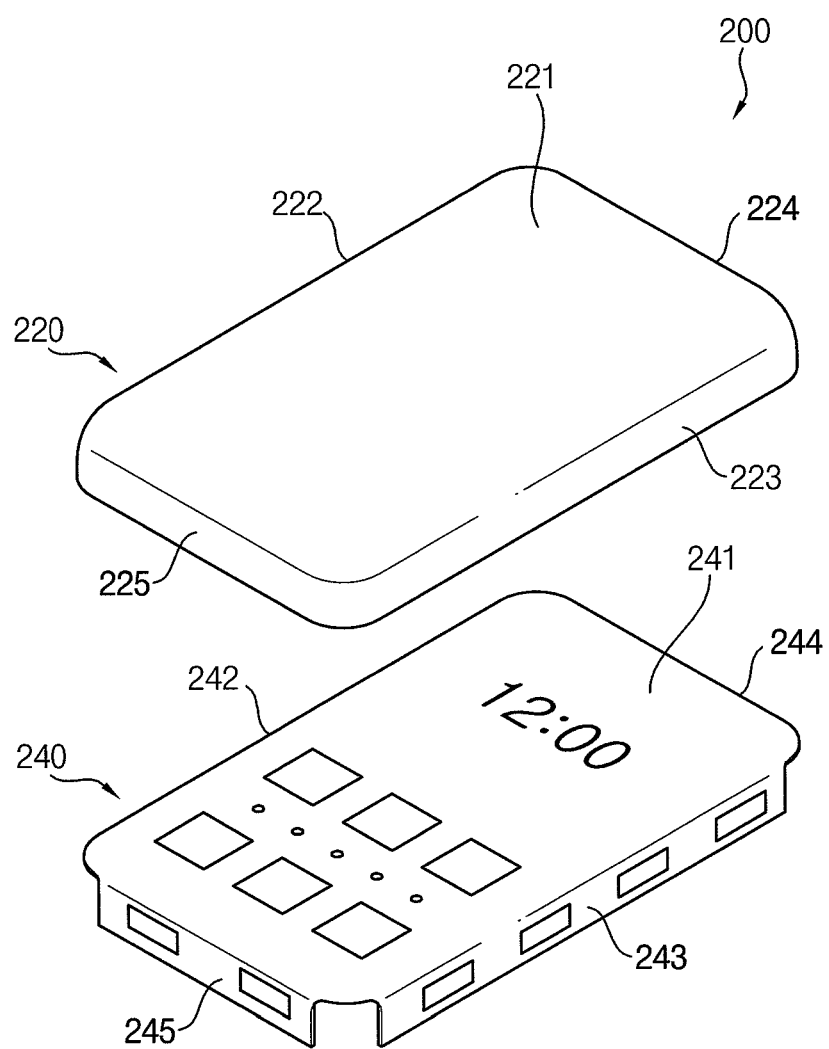
FIG. 3 is a diagram illustrating an alternative exemplary embodiment of the display device.

FIG. 3 is a diagram illustrating an alternative exemplary embodiment of the display device.

Referring to FIG. 3, an exemplary embodiment of a display device 200 may include a window panel 220 and a flexible display panel 240.

The window panel 220 may include a front area 221 and side areas 222, 223, 224, 225. The side areas 222, 223, 224, 225 may extend from the front area 221 and be bent in a predetermined angle, or extend downwardly from the front area 221. The front area 221 of the window panel 220 may have a rectangular shape, a vertex of which is rounded. The side areas 222, 223, 224, 225 may surround the front area 221. The window panel 220 may include the front area 221, a first side area 222, a second side area 223, a third side area 224, and a fourth side area 225. The first side area 222 and the second side area 223 may extend from sides of the front area 221 in a vertical direction. The third side area 224 and the fourth side area 225 may extend from sides of the front area 221 in a horizontal direction. In such an embodiment, the first side area 222 and the third side area 224 may be coupled (e.g., connected) to each other. The third side area 224 and the second side area 223 may be coupled to each other. The second side area 223 and the fourth side area 225 may be coupled to each other. The fourth side area 225 and the first side area 222 may be coupled to each other.

The flexible display panel 240 may be disposed under the window panel 220. The flexible display panel 240 of FIG. 3 may be substantially the same as the flexible display panel 140 of FIG. 1. The flexible display panel 240 may include a flat display area 241 and flexible display areas 242, 243, 244, 245. The flexible display panel 240 may have a shape corresponding to that of the front area 221 of the window panel 220. The flexible display area 242, 243, 244, 245 may have shapes corresponding to those the side areas 222, 223, 224, 225 of the window panel 220, respectively. The flexible display areas 242, 243, 244, 245 may extend from sides of the flat display area 241 and be bent to form a predetermined angle with the flat display area 241. The flat display area 241 may have a rectangular shape, vertexes of which are rounded. Each of the flexible display areas 242, 243, 244, 245 may have a rectangular shape. In such an embodiment, the flexible display areas 242, 245, 244, 245 may be spaced apart from each other. In an exemplary embodiment, as described above, the flexible display panel 240 may not include a bezel when viewed from the front side by including the flat display area 241 having the rectangular shape, a vertex of which is rounded, and flexible display areas 242, 243, 244, 245 extending from the flat display area 241 and bent.

The window panel 220 may be disposed above the flexible display panel 240. The window panel 220 may protect the flexible display panel 240. The window panel 220 of FIG. 3 may cover the flat display area 241, the flexible display areas 242, 243, 244, 245, and spaces between the flexible display areas 242, 243, 244, 245. Thus, the durability of the display device 200 may be improved.

Figure 4:
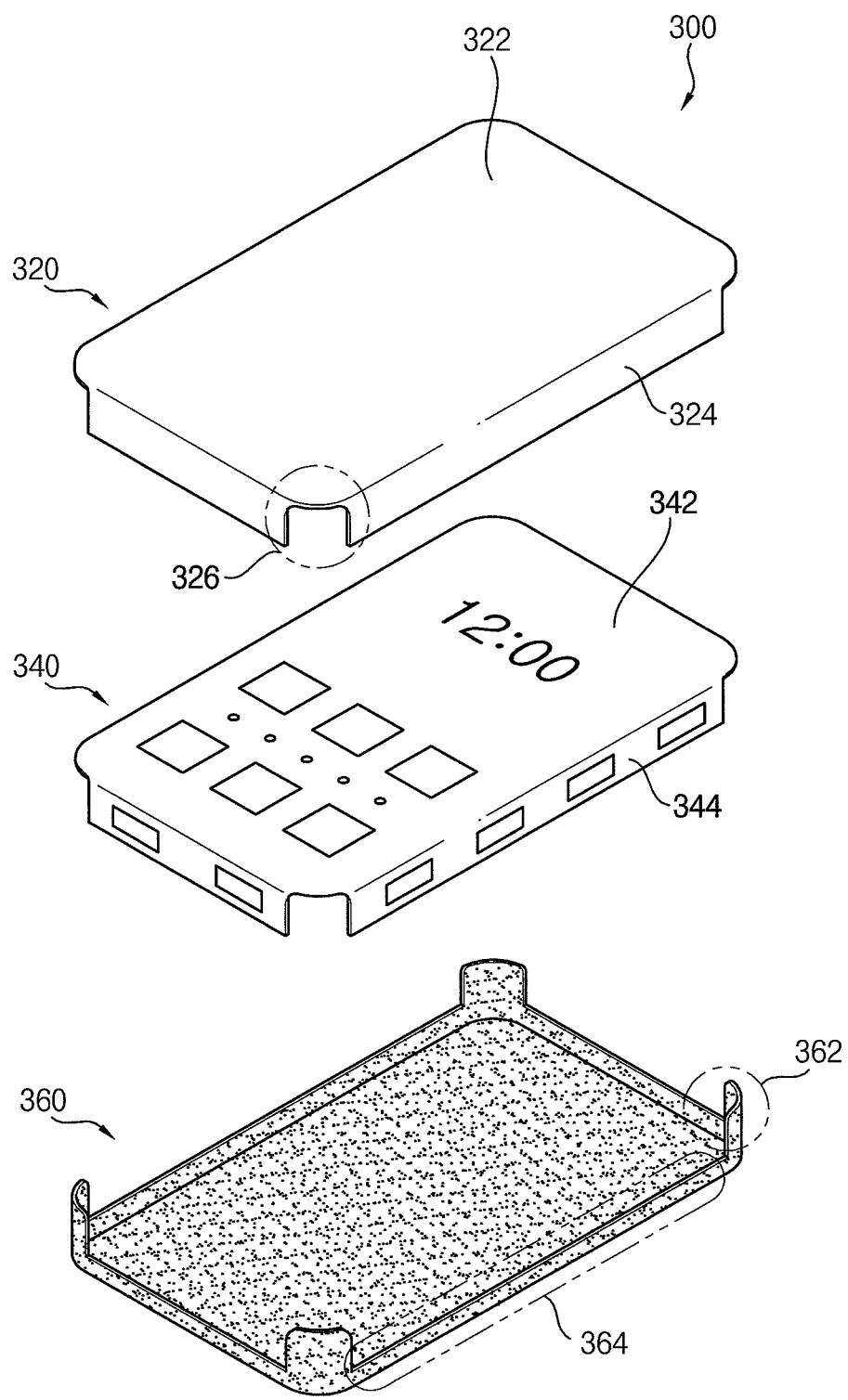
FIGS. 4 and 5 are diagrams illustrating another alternative exemplary embodiment of the display device.
Figure 5:
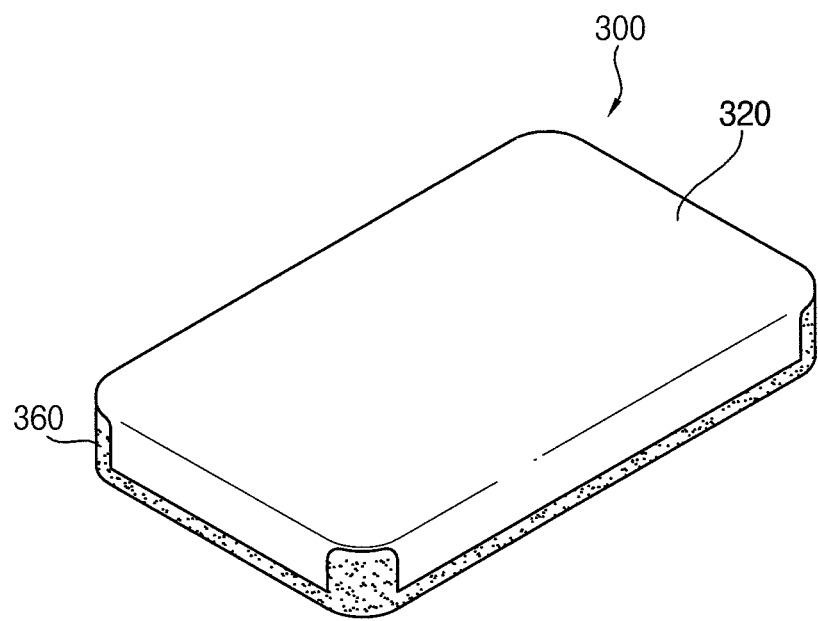

FIGS. 4 and 5 are diagrams illustrating another alternative exemplary embodiment of the display device.

Referring to FIGS. 4 and 5, an exemplary embodiment of a display device 300 may include a window panel 320, a flexible display panel 340, and a back-side member 360.

The window panel 320 and the flexible display panel 340 of FIGS. 4 and 5 may correspond to the window panel 120 and the flexible display panel 140 of FIG. 1, respectively. In such an embodiment, as shown in FIGS. 4 and 5, the display device 300 may further include the back-side member 360. In some exemplary embodiments, the back-side member 360 may be combined with the window panel 320 and the flexible display panel 340. In alternative exemplary embodiments, the back-side member 360 may be combined only with the window panel 320. In other alternative exemplary embodiments, the back-side member 360 may be combined only with the flexible display panel 340.

Referring to FIGS. 4 and 5, the window panel 320 may include a front area 322 and side areas 324. The front area 322 of the window panel 320 may have a rectangular shape, vertexes of which are rounded. The side areas 324 may have the rectangular shape and extending from edges of the front area 322, respectively. The side areas 324 may be spaced apart from each other. Concave regions 326 may be defined by the side areas 324 bent from the front area 322 and spaced apart from each other.

The flexible display panel 340 may be disposed under the window panel 320. In such an embodiment, the flexible display panel 340 may not include the bezel by including the flat display area 342, a vertex of which is rounded, and the flexible display areas 344 extending from the edge of the flat display area 342.

The back-side member 360 may be disposed under the flexible display panel 340. The back-side member 360 may protect the flexible display panel 340 by being combined with the window panel 320. The back-side member 360 may include protrusion regions 362 and flat regions 364. In such an embodiment, as shown in FIG. 4, the protrusion regions 362 and the flat regions 364 may extend upwardly from a main body of the back-side member 360. The protrusion regions 362 may be combined with the concave regions 326 of the window panel 320. The flat regions 364 may be combined with the side regions 324 of the window panel 320.

In an exemplary embodiment, as described above, the durability of the display device 300 of FIGS. 4 and 5 may be improved by disposing the flexible display panel 340 between the window panel 320 and the back-side member 360.

Figure 6:
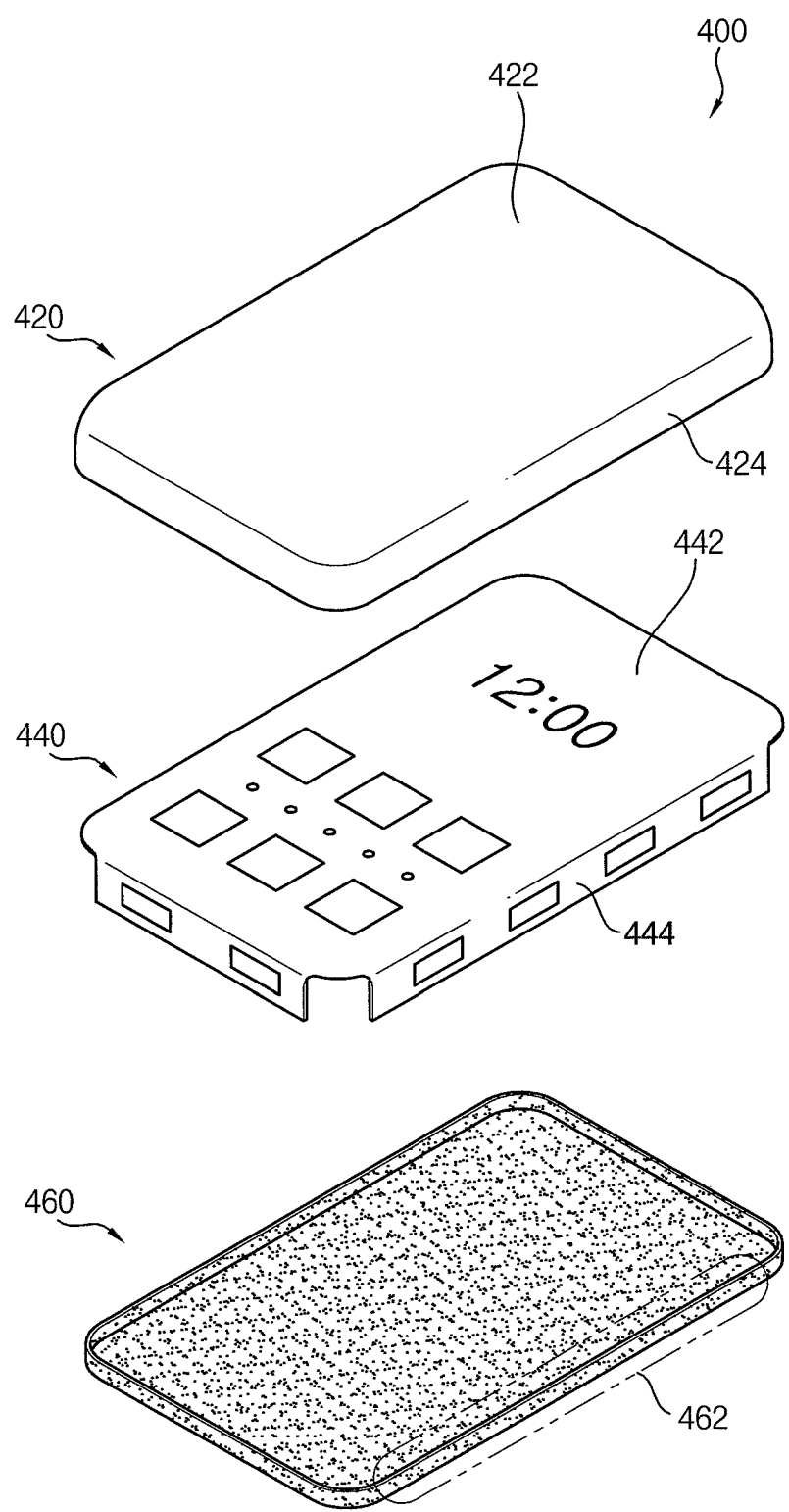
FIGS. 6 and 7 are diagrams illustrating another alternative exemplary embodiment of the display device.
Figure 7:
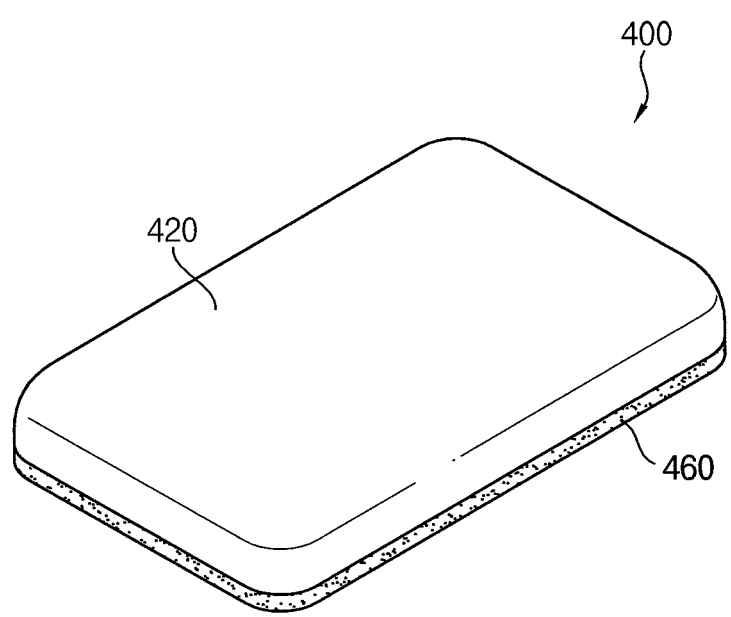

FIGS. 6 and 7 are diagrams illustrating another alternative exemplary embodiment of the display device.

Referring to FIGS. 6 and 7, an exemplary embodiment of a display device 400 may include a window panel 420, a flexible display panel 440, and a back-side member 460.

The window panel 420 and the flexible display panel 440 of FIGS. 6 and 7 may correspond to the window panel 220 and the flexible display panel 240 of FIG. 3. In such an embodiment, as shown in FIGS. 6 and 7, the display device 400 may further include the back-side member 460. In some exemplary embodiments, the back-side member 460 may be combined with (e.g., attached or adhered to) the window panel 420 and the flexible display panel 440. In alternative exemplary embodiments, the back-side member 460 may be combined only with the window panel 420. In other alternative exemplary embodiments, the back-side member 460 may be combined only with the flexible display panel 440.

Referring to FIGS. 6 and 7, the window panel 420 may include a front area 422 and side areas 424. The front area 422 of the window panel may have a rectangular shape, vertexes of which are rounded. The side areas 424 may be formed by bending an extended portion of the front area 422 of the window panel 420 downwardly. The side areas 424 may surround the front area 422.

The flexible display panel 440 may be disposed under the window panel 420. In such an embodiment, the flexible display panel 440 may not include the bezel by including the flat display area 442, a vertex of which is rounded, and the flexible display areas 444 extending from the edge of the flat display area 442.

The back-side member 460 may be disposed under the flexible display panel 440. The back-side member 460 may protect the flexible display panel 440 by being combined with the window panel 420. The back-side member 460 may include flat regions 462. The flat regions 462 may be combined with the side regions 424 of the window panel 420.

In such an embodiment, as described above, the durability of the display device 400 of FIGS. 6 and 7 may be improved by disposing the flexible display panel 440 between the window panel 420 and the back-side member 460.

Figure 8:
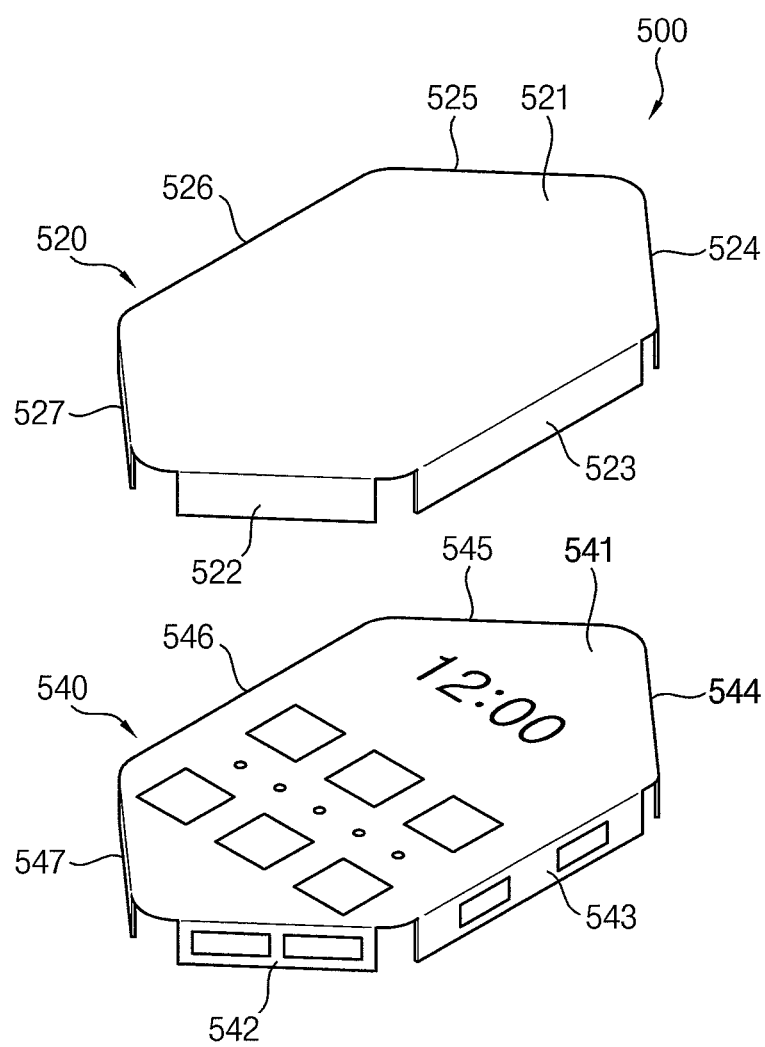
FIG. 8 is a diagram illustrating a display device according to an alternative exemplary embodiment.
Figure 9A:
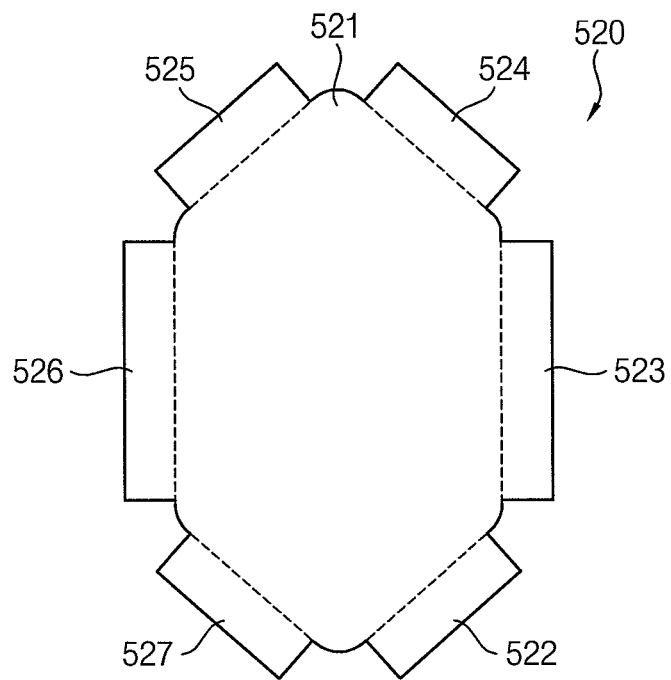
FIG. 9A is a diagram illustrating a window panel included in the display device of FIG. 8.

FIG. 8 is a diagram illustrating a display device according to an alternative exemplary embodiment. FIG. 9A is a diagram illustrating a window panel included in the display device of FIG. 8, and FIG. 9B is a diagram illustrating a flexible display panel included in the display device of FIG. 8.

Figure 9B:
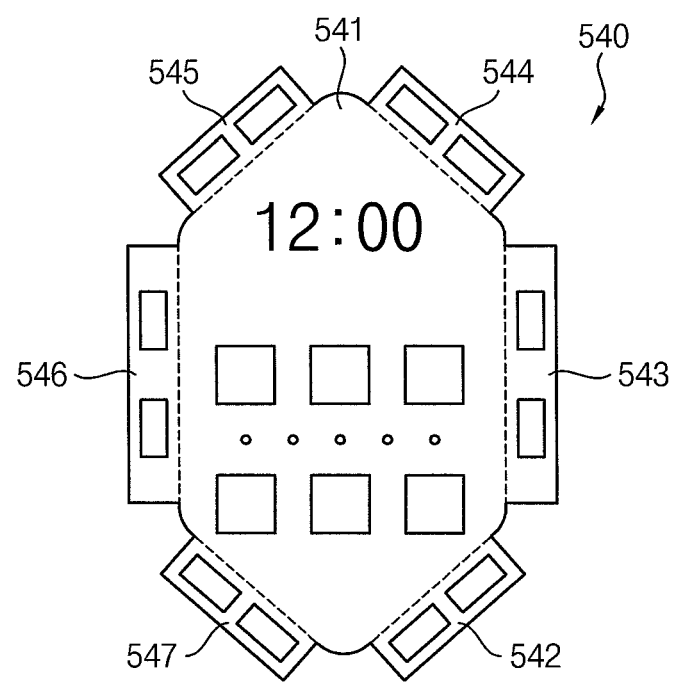
FIG. 9B is a diagram illustrating a flexible display panel included in the display device of FIG. 8.

Referring to FIGS. 8, 9A and 9B, an exemplary embodiment of a display device 500 may include a window panel 520 and a flexible display panel 540.

The window panel 520 may include a front area 521 and side areas 522, 523, 524, 525, 526, 527. The front area 521 of the window panel 520 may have a rounded vertex or a rounded corner. The window panel 520 may have a polygon shape, a vertex of which is rounded. The front area 521 of the window panel may have a hexagon shape, vertexes of which are rounded, as shown in FIGS. 8 and 9A. The side areas 522, 523, 524, 525, 526, 527 extending from the front area 521 may have a rectangular shape. The side areas 522, 523, 524, 525, 526, 527 may be spaced apart from each other.

The flexible display panel 540 may be disposed under the window panel 520. The flexible display panel 540 may include a flat display area 541 and flexible display areas 542, 543, 544, 545, 546, 547. The flat display area 541 of the flexible display panel 540 may have a shape corresponding to that of the front area 521 of the window panel 520. The flexible display areas 542, 543, 544, 545, 546, 547 may have shapes corresponding to those of the side areas 522, 523, 524, 525, 526, 527 of the window panel 520, respectively. The flat display area 541 of the flexible display panel 540 may have a rounded vertex or a rounded corner. The flat display area 541 may have a polygon shape, a vertex of which is rounded. The flat display area 541 of the flexible display panel 540 may have a hexagon shape, vertexes of which are rounded, as shown in FIGS. 8 and 9B. The flexible display areas 542, 543, 544, 545, 546, 547 of the flexible display panel 540 may have a rectangular shape. The flexible display areas 542, 543, 544, 545, 546, 547 may be spaced apart from each other. The flat display area 541 and the flexible display areas 542, 543, 544, 545, 546, 547 may respectively display images.

Figure 10:
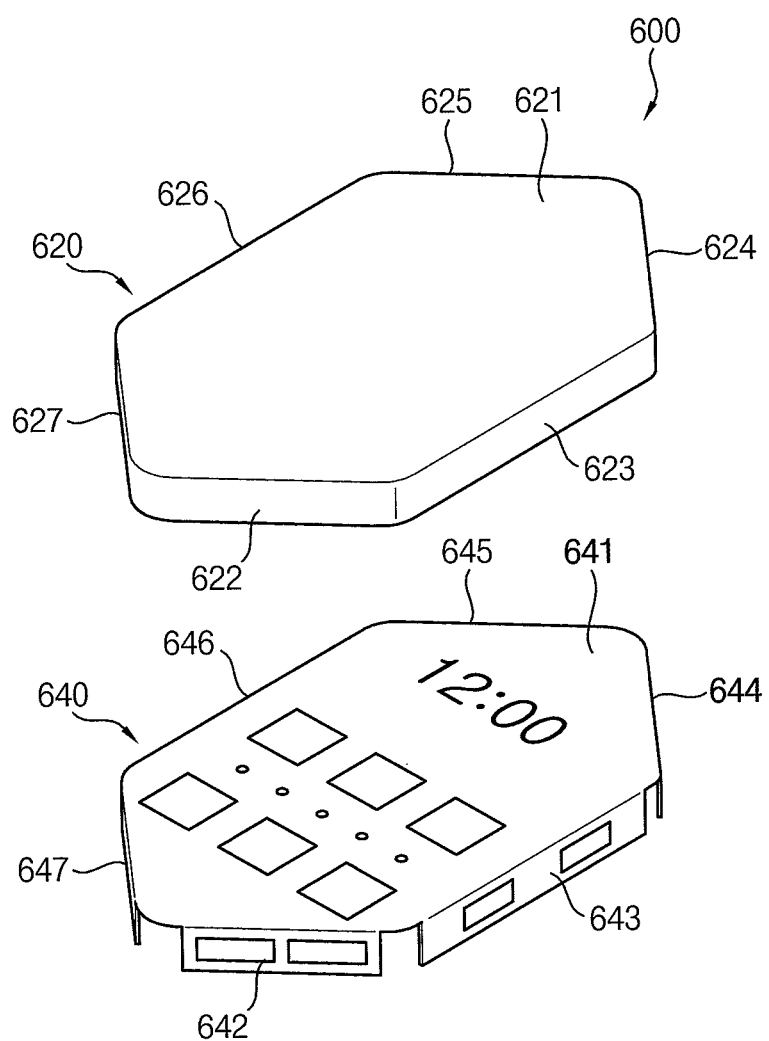
FIG. 10 is a diagram illustrating another alternative exemplary embodiment of the display device.

FIG. 10 is a diagram illustrating another alternative exemplary of the display device.

Referring to FIG. 10, a display device 600 may include a window panel 620 and a flexible display panel 640. The window panel 620 may include a front area 621 and side areas 622, 623, 624, 625, 626, 627, and the flexible display panel 640 may include a flat display area 641 and flexible display areas 642, 643, 644, 645, 646, 647. The display device 600 of FIG. 10 may be substantially the same as the display device 500 of the FIG. 8 except that the side areas 622, 623, 624, 625, 626, 627 of the window panel 620 are coupled each other. The window panel 620 of FIG. 10 may cover the flat display area 641, the flexible display areas 642, 643, 644, 645, 646, 647, and spaces between the flexible display areas 642, 643, 644, 645, 646, 647. Thus, the durability of the display device 600 may be improved.

Figure 11:
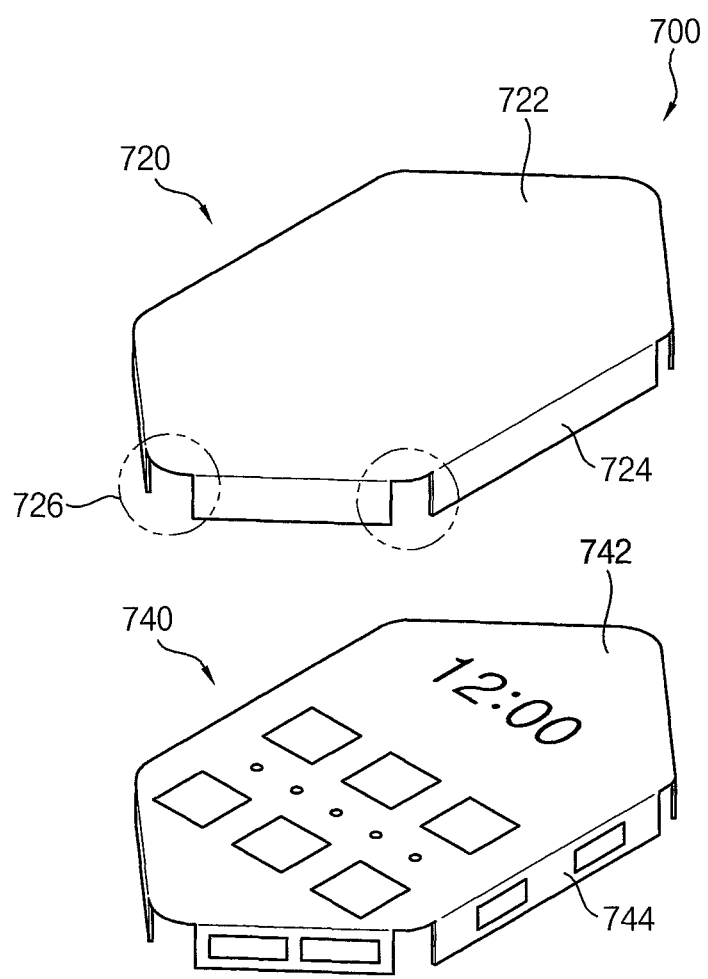
FIGS. 11 and 12 are diagrams illustrating another alternative exemplary embodiment of the display device.
Figure 11:
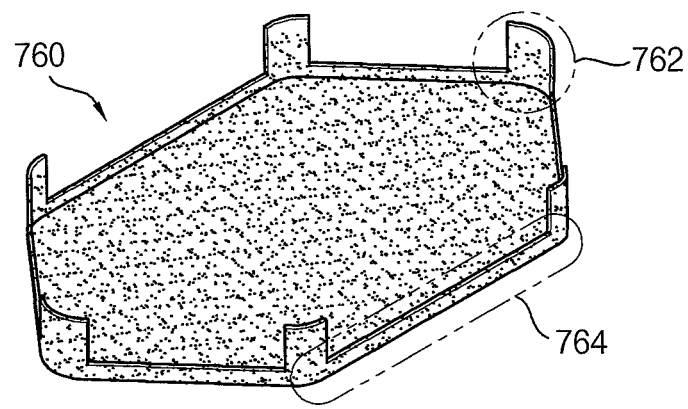
Figure 12:
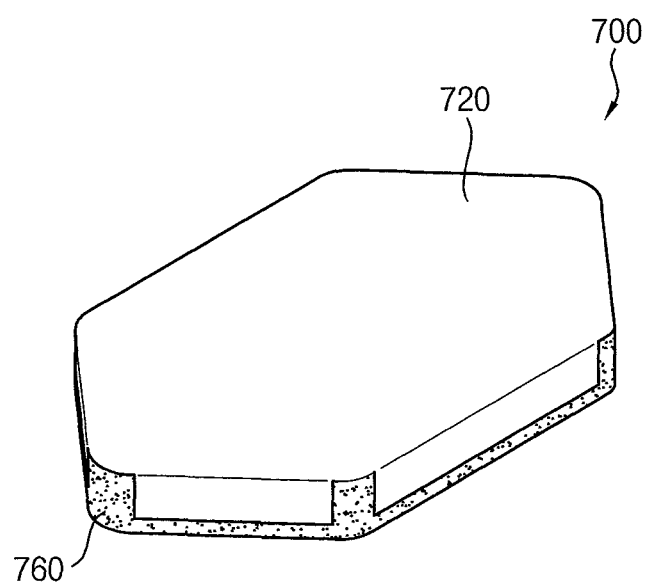

FIGS. 11 and 12 are diagrams illustrating another alternative exemplary embodiment of the display device.

Referring to FIGS. 11 and 12, an exemplary embodiment of a display device 700 may include a window panel 720, a flexible display panel 740, and a back-side member 760. The window panel 720 and the flexible display panel 740 of FIGS. 11 and 12 may correspond to the window panel 520 and the flexible display panel 540 of FIG. 8. The display device 700 of FIGS. 11 and 12 may further include the back-side member 760, as shown in FIG. 8. In some exemplary embodiments, the back-side member 760 may be combined with the window panel 720 and the flexible display panel 740. In alternative exemplary embodiments, the back-side member 760 may be combined only with the window panel 720. In other alternative exemplary embodiments, the back-side member 760 may be combined only with the flexible display panel 740

Referring to FIGS. 11 and 12, a front area 722 of the window panel 720 may have a hexagon shape, a vertex of which is rounded. The side areas 724 may have the rectangular shape and extend from edges of the front area 722. The side areas 724 may be spaced apart from each other. Concave regions 726 may be defined by the side areas 724 spaced apart from each other.

The flexible display panel 740 may be disposed under the window panel 720. In such an embodiment, the flexible display panel 740 may not include the bezel by including the flat display area 742 having the hexagon shape, a vertex of which is rounded, and the flexible display areas 744 extending from the edge of the flat display area 742.

The back-side member 760 may be disposed under the flexible display panel 740. The back-side member 760 may protect the flexible display panel 740 by being combined with the window panel 720. The back-side member 760 may include protrusion regions 762 and flat regions 764. The protrusion regions 762 of the back-side member 760 may be combined with the concave regions 726 of the window panel 720. The flat regions 764 of the back-side member 760 may be combined with the side areas 724 of the window panel 720.

Figure 13:
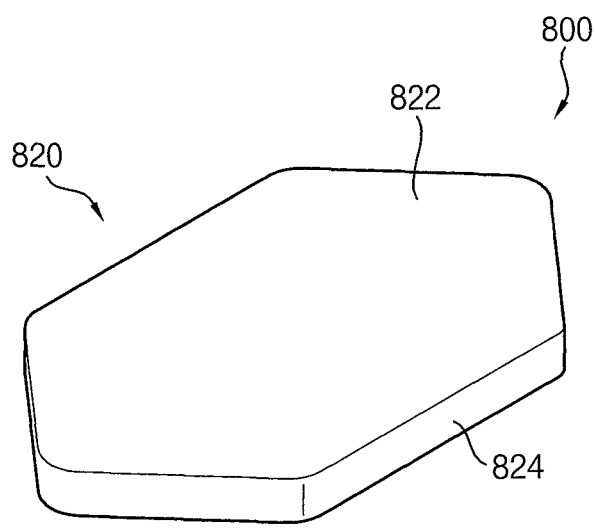
FIGS. 13 and 14 are diagrams illustrating another alternative exemplary embodiment of the display device.
Figure 13:
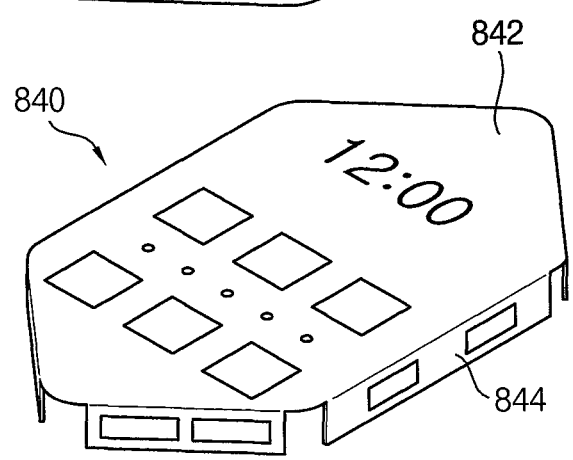
Figure 13:
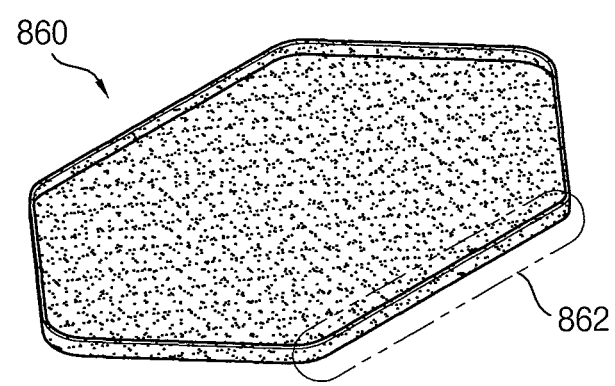
Figure 14:
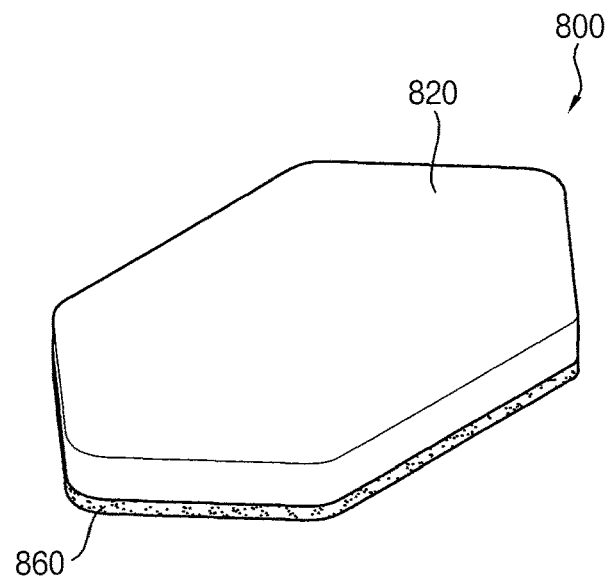

FIGS. 13 and 14 are diagrams illustrating another alternative exemplary embodiment of the display device.

A window panel 820 and a flexible display panel 840 of FIGS. 13 and 14 may correspond to the window panel 620 and flexible display panel 640 of FIG. 10. The display device 800 of FIGS. 13 and 14 may further include a back-side member 860. In some exemplary embodiments, the back-side member 860 may be combined with the window panel 820 and the flexible display panel 840. In alternative exemplary embodiments, the back-side member 860 may be combined only with the window panel 820. In other alternative exemplary embodiments, the back-side member 860 may be combined only with the flexible display panel 840.

Referring to FIGS. 13 and 14, the window panel 820 may include a front area 822 and side areas 824. The front area 822 of the window panel 820 may have a hexagon shape, a vertex of which is rounded. The side areas 824 may be formed by bending an extended portion of the front area 822 downwardly. The side area 824 may surround the front area 822.

The flexible display panel 840 may be disposed under the window panel 820. In such an embodiment, the flexible display panel 840 may not include the bezel by including the flat display area 842, a vertex of which is rounded, and the flexible display areas 844 extending from the edge of the flat display area 842 in a downward direction.

The back-side member 860 may be disposed under the flexible display panel 840. The back-side member 860 may protect the flexible display panel 840 by being combined with the window panel 820. The back-side member 860 may include flat regions 862. The flat regions 862 may be combined with the side areas 824 of the window panel 820.

Figure 15:
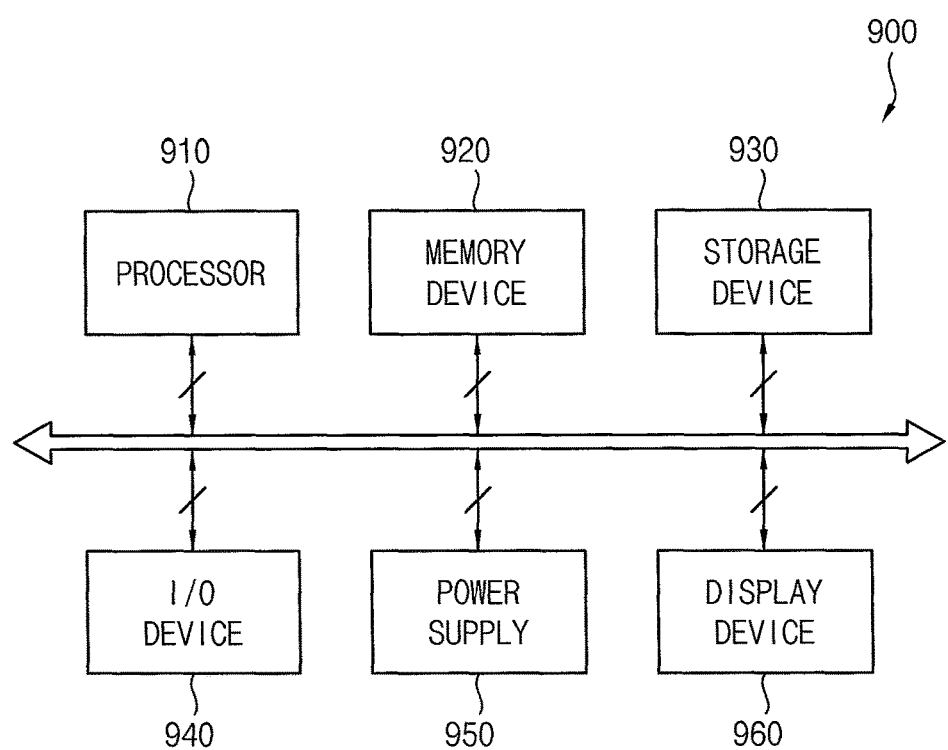
FIG. 15 is a block diagram illustrating an electronic device according to an exemplary embodiment.
Figure 16:
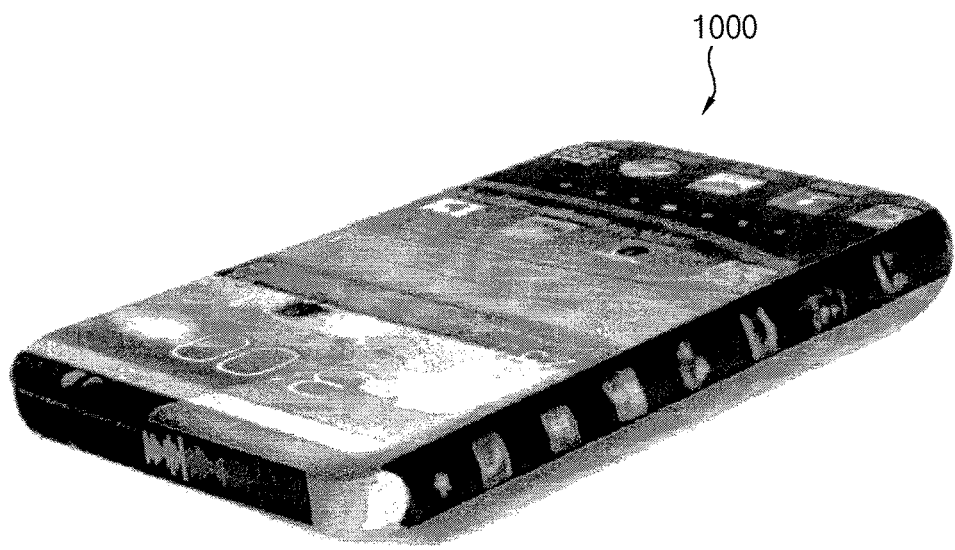
FIGS. 16 and 17 are views illustrating an exemplary embodiment in which the electronic device of FIG. 15 is implemented as a smart phone.
Figure 17:
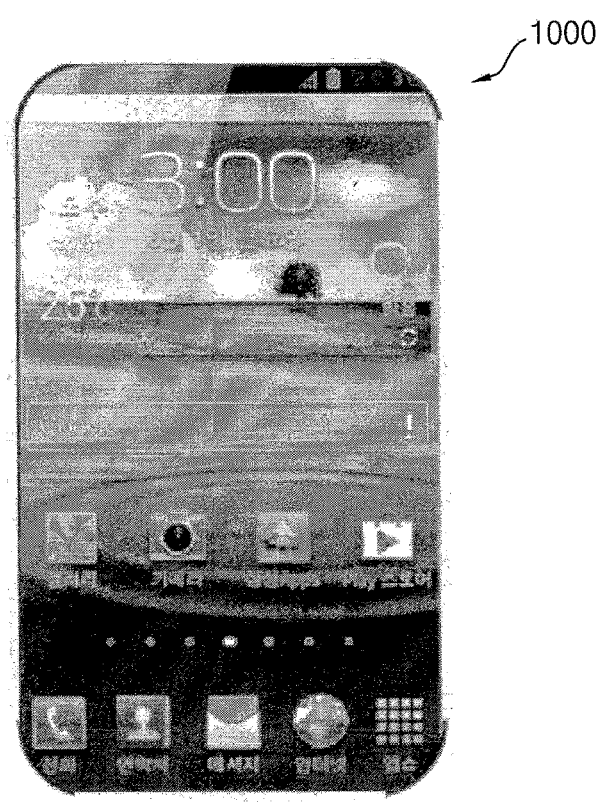

FIG. 15 is a block diagram illustrating an electronic device according to an exemplary embodiment, and FIGS. 16 and 17 are views illustrating an exemplary embodiment in which the electronic device of FIG. 15 is implemented as a smart phone.

Referring to FIGS. 15 through 17, an exemplary embodiment of an electronic device 900 may include a processor 910, a memory device 920, a storage device 930, an input/output ("I/O") device 940, a power device 950, and a display device 960. Here, the display device 960 may correspond to the display device 100, 200, 500, 600 of FIGS. 1, 3, 8 and 10. In such an embodiment, the electronic device 900 may further include a plurality of ports for communicating a video card, a sound card, a memory card, a universal serial bus ("USB") device, other electronic device, etc. In an exemplary embodiment, as shown in FIGS. 16 and 17, the electronic device 900 may be implemented as a smart phone 1000, but the type of the electronic device 900 is not limited thereto.

The processor 910 may perform various computing functions. The processor 910 may be a microprocessor or a central processing unit ("CPU"), etc. The processor 910 may be coupled to other components via an address bus, a control bus, a data bus, etc. Further, the processor 910 may be coupled to an extended bus such as surrounded component interconnect ("PCI") bus. The memory device 920 may store data for operations of the electronic device 900. In one exemplary embodiment, for example, the memory device 920 may include a non-volatile memory device such as an erasable programmable read-only memory ("EPROM") device, an electrically erasable programmable read-only memory ("EEPROM") device, a flash memory device, a phase change random access memory ("PRAM") device, a resistance random access memory ("RRAM") device, a nano floating gate memory ("NFGM") device, a polymer random access memory ("PoRAM") device, a magnetic random access memory ("MRAM") device, a ferroelectric random access memory ("FRAM") device, etc., and/or a volatile memory device such as a dynamic random access memory ("DRAM") device, a static random access memory ("SRAM") device, a mobile DRAM device, etc. The storage device 930 may be a solid stage drive ("SSD") device, a hard disk drive ("HDD") device, a compact disc read-only memory ("CD-ROM") device, etc.

The I/O device 940 may be an input device such as a keyboard, a keypad, a touchpad, a touch-screen, a mouse, etc., and an output device such as a printer, a speaker, etc. In some exemplary embodiments, the display device 960 may be included in the I/O device 940. The power device 950 may provide a power for operations of the electronic device 900. The display device 960 may communicate with other components via the buses or other communication links. In such an embodiment, as described above, the display device 960 may include a window panel and a flexible display panel.

The window panel may include a front area and side areas extending from the front area in a downward direction. The front area of the window panel may have a rounded vertex or a rounded corner. The front area of the window panel may have a polygon shape, a vertex of which is rounded. In one exemplary embodiment, for example, the front area of the window panel may have a rectangular shape or a hexagon shape, a vertex of which is rounded. The window panel may include a first side area, a second side area, a third side area and a fourth side area, which are extending from edges of the front area in a rectangular shape, vertexes of which are rounded. The first side area and the second side area may extend from the front area in a horizontal direction. The third area and the fourth area may extend from the front area in a vertical direction.

In some exemplary embodiments, the first side area, the second side area, the third side area and the fourth side area may be spaced apart from each other. In such embodiments, a length of the first side area and a length of the second side area may be shorter than a length of the front area in the vertical direction. A length of the third side area and a length of the fourth side area may be shorter than a length of the front area in the horizontal direction. The display device 960 may further include a back-side member that includes protrusion regions combined with the vertex of the front area and flat regions combined with the first side area, the second side area, the third side area and the fourth side area.

In alternative exemplary embodiments, the first side area, the second side area, the third side area and the fourth side area may be coupled to one another. The display device 960 may further include a back-side member that includes flat region combined with the first side area, the second side area, the third side area, and the fourth side area.

The flexible display panel may be disposed under the window panel. The flexible display panel may include a flat display area corresponding to the front area of the window panel and flexible display areas extending from the flat display area. The flat display area may have a rounded vertex or a rounded corner. The flat display area may have a polygon shape, a vertex of which is rounded. In one exemplary embodiment, for example, the flexible display panel may have a rectangular shape or a hexagon shape, vertexes of which are rounded. The flexible display regions may be formed, or have a shape, corresponding to the side areas. The flexible display areas extending form the flat display area may have the rectangular shape. The flexible display panel may include a first flexible display area, a second flexible display area, a third flexible display area and a fourth flexible display area in an exemplary embodiment, where the flat display area is formed in the rectangular shape vertexes of which are rounded. The first flexible display area, the second flexible display area, the third flexible display area and the fourth flexible display area may be spaced apart from each other. In such an embodiment, a length of the first flexible display area and a length of the second flexible display area may be shorter than a length of the flat display area in the vertical direction, and a length of the third display area and a length of the fourth display area may be shorter than a length of the flat display area in the horizontal direction. A plurality of pixels may be disposed in the flat display area and the flexible display areas of the flexible display panel. An image may be displayed on each of the flat display area and the flexible display areas.

In an exemplary embodiment, as described above, the display device 960 of the electronic device 900 may not include the bezel by including the flexible display panel that includes the flexible display areas extending from the flat display area. Thus, the electronic device 900 may be implemented as various field by including a bezel-less display device 960.

The invention may be applied to a display device and an electronic device including the display device. Exemplary embodiments of the invention as set forth herein may be applied to a computer monitor, a laptop, a digital camera, a cellular phone, a smart phone, a smart pad, a television, a personal digital assistant ("PDA"), a portable multimedia player ("PMP"), a MP3 player, a navigation system, a game console a video phone, for example.

The foregoing is illustrative of exemplary embodiments and is not to be construed as limiting thereof. Although a few exemplary embodiments have been described, those skilled in the art will readily appreciate that many modifications are possible in the exemplary embodiments without materially departing from the novel teachings and advantages of the invention. Accordingly, all such modifications are intended to be included within the scope of the invention as defined in the claims. Therefore, it is to be understood that the foregoing is illustrative of various exemplary embodiments and is not to be construed as limited to the specific exemplary embodiments disclosed, and that modifications to the disclosed exemplary embodiments, as well as other exemplary embodiments, are intended to be included within the scope of the appended claims.

What is claimed is:

1. A display device comprising:
a window panel including a front area, and side areas extending from the front area; and
a flexible display panel disposed under the window panel, wherein the flexible display panel includes a flat display area corresponding to the front area of the window panel, and a plurality of flexible display areas extending directly from the flat display area,
wherein the flat display area has a rounded vertex,
wherein a pair of contiguous flexible display areas of the plurality of flexible display areas are spaced apart from each other via the rounded vertex therebetween contiguous edges defining each of the respective pair of contiguous flexible display areas,
wherein the pair of contiguous flexible display areas are each defined by a plane, each of the contiguous edges of the planes terminate at a respective end of two opposing terminal ends defining the rounded vertex, and an entirety of the spaced apart contiguous edges do not contact each other defining a void at corner of the display device aligned with the rounded vertex in a top plan view, the rounded vertex coplanar with a plane defining the flat display area; and
wherein the display device is absent a non-display area when viewed from a front side.

2. The display device of claim 1, wherein the flat display area has a polygonal shape, a vertex of which is rounded.

3. The display device of claim 1, wherein the flexible display areas of the flexible display panel correspond to the side areas of the window panel, respectively.

4. The display device of claim 1, wherein each of the flexible display areas has a rectangular shape.

5. The display device of claim 1, wherein the flexible display panel includes:
a first flexible display area extending from the flat display area in a horizontal direction;
a second flexible display area extending from the flat display area in the horizontal direction;
a third flexible display area extending from the flat display area in a vertical direction; and
a fourth flexible display area extending from the flat display area in the vertical direction.

6. The display device of claim 5, wherein
the first flexible display area and the third flexible display area are spaced apart from each other,
the third flexible display area and the second flexible display area are spaced apart from each other,
the second flexible display area and the fourth flexible display area are spaced apart from each other, and
the fourth flexible display area and the first flexible display area are spaced apart from each other.

7. The display device of claim 5, wherein
a length of the first flexible display area in the vertical direction and a length of the second flexible display area in the vertical direction are shorter than a length of the flat display area in the vertical direction, and
a length of the third flexible display area in the horizontal direction and a length of the fourth flexible display area in the horizontal direction are shorter than a length of the flat display area in the horizontal direction.

8. The display device of claim 1, wherein the front area of the window panel has a polygonal shape, a vertex of which is rounded.

9. The display device of claim 1, wherein each of the side areas of the window panel has a rectangular shape.

10. The display device of claim 1, wherein the window panel includes:
a first side area extending from the front area in a horizontal direction;
a second side area extending from the front area in the horizontal direction;
a third side area extending from the front area in a vertical direction; and
a fourth side area extending from the front area in the vertical direction.

11. The display device of claim 10, wherein
the first side area and the third side area are spaced apart from each other,
the third side area and the second side area are spaced apart from each other,
the second side area and the fourth side area are spaced apart from each other, and
the fourth side area and the first side area are spaced apart from each other.

12. The display device of claim 10, wherein
a length of the first side area in the vertical direction and a length of the second side area in the vertical direction are shorter than a length of the front area in the vertical direction, and
a length of the third side area in the horizontal direction and a length of the fourth side area in the horizontal direction are shorter than a length of the front area in the horizontal direction.

13. The display device of claim 12, further comprising:
a back-side member including:
a protrusion region combined with the vertex of the front area; and
flat regions combined with the first side area, the second side area, the third side area and the fourth side area, respectively.

14. The display device of claim 10, wherein
the first side area and the third side area are coupled to each other,
the third side area and the second side area are coupled to each other,
the second side area and the fourth side area are coupled to each other, and
the fourth side area and the first side area are coupled to each other.

15. The display device of claim 14, further comprising:
a back-side member including a flat region combined with the first side area, the second side area, the third side area and the fourth side area.

16. The display device of claim 1, further comprising:
a back-side member combined with the window panel and the flexible display panel.

17. The display device of claim 1, further comprising:
a back-side member combined with the flexible display panel.

18. The display device of claim 1, further comprising:
a back-side member combined with the window panel.

19. An electronic device comprising:
a display device; and
a processor which controls the display device,
wherein the display device comprising:
  a window panel including a front area, and side areas extending form the front area; and
  a flexible display panel disposed under the window panel,
  wherein the flexible display panel includes a flat display area corresponding to the front area, and a plurality of flexible display areas extending directly from the flat display area,
  wherein the flat display area has a rounded corner,
  wherein a pair of contiguous flexible display areas of the plurality of flexible display areas are spaced apart from each other via the rounded corner therebetween contiguous edges defining each of the respective pair of contiguous flexible display areas; and
  wherein the pair of contiguous flexible display areas are each defined by a plane, each of the contiguous edges of the planes terminate at a respective end of two opposing terminal ends defining the rounded vertex, and an entirety of the spaced apart contiguous edges do not contact each other defining a void at corner of the display device aligned with the rounded vertex in a top plan view, the rounded vertex coplanar with a plane defining the flat display area; and
  wherein the display device is absent a non-display area when viewed from a front side.

20. The electronic device of claim 19, wherein the flat display area has a polygonal shape, a vertex of which is rounded.

21. The electronic device of claim 19, wherein the flexible display areas of the flexible display panel correspond to the side areas of the window panel, respectively.

22. The electronic device of claim 19, wherein each of the flexible display areas has a rectangular shape.

23. The electronic device of claim 19, wherein the flexible display panel includes:
a first flexible display area extending from the flat display area in a horizontal direction;
a second flexible display area extending from the flat display area in the horizontal direction;
a third flexible display area extending from the flat display area in a vertical direction; and
a fourth flexible display area extending from the flat display area in the vertical direction.

24. The electronic device of claim 23, wherein
the first flexible display area and the third flexible display area are spaced apart from each other,
the third flexible display area and the second flexible display area are spaced apart from each other,
the second flexible display area and the fourth flexible display area are spaced apart from each other, and
the fourth flexible display area and the first flexible display area are spaced apart from each other.

25. The electronic device of claim 23, wherein
a length of the first flexible display area in the vertical direction and a length of the second flexible display area in the vertical direction are shorter than a length of the flat display area in the vertical direction, and
a length of the third flexible display area in the horizontal direction and a length of the fourth flexible display area in the horizontal direction are shorter than a length of the flat display area in the horizontal direction.

26. The electronic device of claim 19, wherein the front area of the window panel has a polygonal shape, a vertex of which is rounded.

27. The electronic device of claim 19, wherein each of the side areas of the window panel has a rectangular shape.

28. The electronic device of claim 19, wherein the window panel includes:
a first side area extending from the front area in a horizontal direction;
a second side area extending from the front area in the horizontal direction;
a third side area extending from the front area in a vertical direction; and
a fourth side area extending from the front area in the vertical direction.

29. The electronic device of claim 28, wherein
the first side area and the third side area are spaced apart from each other,
the third side area and the second side area are spaced apart from each other,
the second side area and the fourth side area are spaced apart from each other, and
the fourth side area and the first side area are spaced apart from each other.

30. The electronic device of claim 28, wherein
a length of the first side area in the vertical direction and a length of the second side area in the vertical direction are shorter than a length of the front area in the vertical direction, and
a length of the third side area in the horizontal direction and a length of the fourth side area in the horizontal direction are shorter than a length of the front area in the horizontal direction.

31. The electronic device of claim 30, further comprising:
a back-side member including:
  a protrusion region combined with a vertex of the front area; and
  flat regions combined with the first side area, the second side area, the third side area and the fourth side area, respectively.

32. The electronic device of claim 28, wherein
the first side area and the third side area are coupled to each other,
the third side area and the second side area are coupled to each other,
the second side area and the fourth side area are coupled to each other, and
the fourth side area and the first side area are coupled to each other.

33. The electronic device of claim 32, further comprising:
a back-side member including a flat region combined with the first side area, the second side area, the third side area and the fourth side area.

34. The electronic device of claim 19, further comprising:
a back-side member combined with the window panel and the flexible display panel.

35. The electronic device of claim 19, further comprising:
a back-side member combined with the flexible display panel.

36. The electronic device of claim 19, further comprising:
a back-side member combined with the window panel.

37. The display device of claim 1, wherein the pair of contiguous flexible display areas of the plurality of flexible display areas comprise:
- a first flexible display area extending from the flat display area in a horizontal direction; and
- a second flexible display area extending from the flat display area in the vertical direction.

38. The electronic device of claim 19, wherein the contiguous pair of flexible display areas of the plurality of flexible display areas includes:
- a first flexible display area extending from the flat display area in a horizontal direction; and
- a second flexible display area extending from the flat display area in the vertical direction.

\* \* \* \* \*